United States Patent
Yamamoto

(10) Patent No.: US 7,650,124 B2
(45) Date of Patent: Jan. 19, 2010

(54) BALANCED AND UNBALANCED ELECTRONIC CIRCUIT AND TELEVISION TUNER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 749 days.

(21) Appl. No.: 11/479,286

(22) Filed: Jun. 30, 2006

(65) Prior Publication Data

US 2007/0046834 A1 Mar. 1, 2007

(30) Foreign Application Priority Data

Aug. 29, 2005 (JP) .............................. 2005-248236

(51) Int. Cl.
*H04B 1/18* (2006.01)
(52) U.S. Cl. .................. 455/188.2; 455/180.2; 348/725
(58) Field of Classification Search .............. 455/150.1, 455/179.1, 180.1, 180.2, 188.1, 188.2, 333; 348/725, 731
See application file for complete search history.

(56) References Cited

U.S. PATENT DOCUMENTS

| | | | | |
|---|---|---|---|---|
| 4,499,602 A | * | 2/1985 | Hermeling et al. | ....... 455/180.3 |
| 4,677,692 A | * | 6/1987 | Sakashita et al. | ............. 455/333 |
| 4,912,520 A | | 3/1990 | Yamamoto et al. | |
| 5,619,283 A | * | 4/1997 | Pugel | ......................... 348/731 |
| 7,019,790 B2 | * | 3/2006 | Yamamoto | ................... 348/725 |

FOREIGN PATENT DOCUMENTS

| | | |
|---|---|---|
| JP | 7-16134 | 2/1995 |
| JP | 2003-51860 | 2/2003 |
| JP | 2003-309777 | 10/2003 |

OTHER PUBLICATIONS

European Search Report dated Sep. 27, 2006 from corresponding European Patent Application No. 06017566.8-1233.

* cited by examiner

*Primary Examiner*—Quochien B Vuong
(74) *Attorney, Agent, or Firm*—Beyer Law Group LLP

(57) ABSTRACT

A television tuner includes an unbalanced output type VHF-side block, a balanced output type UHF-side block, and a mixing circuit that performs frequency conversion on the output from the VHF-side block or the UHF-side block. In the television tuner, in a first mode where the VHF-side block is connected to the mixing circuit, a first terminal, to which the unbalanced output is applied, is coupled to a first input terminal of the mixing circuit, and a second input terminal of the mixing circuit is grounded. Further, in a second mode where the UHF-side block is connected to the mixing circuit, a second terminal and a third terminal, to which the balanced output is applied, are coupled to the first and second input terminals of the mixing circuit.

5 Claims, 7 Drawing Sheets

BALANCED AND UNBALANCED ELECTRONIC CIRCUIT AND TELEVISION TUNER

BACKGROUND OF THE INVENTION

1. Field of the Invention

The present invention relates to an electronic circuit that has a balanced output and an unbalanced output together, and a television tuner having such an electronic circuit.

2. Description of the Related Art

In the related art, as an input method to a mixing circuit having a differential circuit, there are known a method that directly inputs balanced input signals to differential input terminals (for example, see JP-A-2003-51860) and a method that grounds one differential input terminal so as to use the differential input terminal as an unbalanced input terminal (for example, see JP-A-2003-309777). As an electronic circuit that has a balanced output and an unbalanced output together, a UHF-VHF television tuner is known.

FIG. 7 is a block diagram showing the configuration of a television tuner according to the related art. FIG. 7 shows the configuration from an antenna to an intermediate-frequency amplifying circuit. A television tuner 100 shown in FIG. 7 includes a UHF-side block 101 and a VHF-side block 102. The UHF-side block 101 includes an antenna tuning circuit 111, a high-frequency amplifying circuit 112, an interstage tuning circuit 113, and a mixing circuit 114. All the elements are sequentially connected in a cascade manner. Similarly, the VHF-side block 102 includes an antenna tuning circuit 121, a high-frequency amplifying circuit 122, an interstage tuning circuit 123, and a mixing circuit 124. All the elements are sequentially connected in a cascade manner.

In the VHF-side block 102, a high-band or low-band high-frequency signal of a VHF band is extracted by the antenna tuning circuit 121, and the extracted signal is amplified by the high-frequency amplifying circuit 122. A desired television signal is selected according to a tuning voltage corresponding to channel-selection data by the interstage tuning circuit 123, and the selected television signal is output to the mixing circuit 124 in an unbalance manner.

Here, the interstage tuning circuit 113 of the VHF-side block 102 is an unbalanced circuit of an unbalanced output type. The interstage tuning circuit 113 is coupled to only one input terminal of the mixing circuit 124 having a differential circuit, and the other input terminal thereof is fixedly grounded. The mixing circuit 124 mixes a local oscillation signal, which is input from a VHF high-band oscillation circuit 125 or a VHF low-band oscillation circuit 126, and the selected television signal, and performs frequency conversion of the mixed signal into an intermediate-frequency signal. The intermediate-frequency signal of the selected television signal is extracted by an intermediate-frequency tuning circuit 131, is amplified by an intermediate-frequency amplifier 132, and is input to a rear-stage circuit (not shown).

In the UHF-side block 101, a television signal of a UHF band is extracted by the antenna tuning circuit 111 and is amplified by the high-frequency amplifying circuit 112. Then, a desired television signal is selected according to a tuning voltage corresponding to channel-selection data by the interstage tuning circuit 113, and the selected television signal is output to the mixing circuit 114 in a balanced manner.

Here, the interstage tuning circuit 113 of the UHF-side block 101 is a balanced circuit of a balanced output type. The interstage tuning circuit 113 is coupled to both input terminals of the mixing circuit 114 having a differential circuit. The mixing circuit 114 mixes a local oscillation signal, which is input from a UHF oscillation circuit 127, and the selected television signal, and performs frequency conversion of the mixed signal into an intermediate-frequency signal. The intermediate-frequency signal of the selected television signal is extracted by the intermediate-frequency tuning circuit 131, is amplified by the intermediate-frequency amplifier 132, and is input to the rear-stage circuit (not shown).

However, according to this configuration, since the unbalanced input type mixing circuit 124 corresponding to the unbalanced output of the interstage tuning circuit 123 of the VHF-side block 2, and the balanced input type mixing circuit 114 corresponding to the balanced output of the interstage tuning circuit 113 of the UHF-side block 101 are separately provided, costs are increased and the size of the circuit is increased. In particular, when a portion 140 (the mixing circuits and the local oscillation circuits) surrounded by a dotted line is integrated as an integrated circuit, it is difficult to reduce the size because the two mixing circuits 114 and 124 exist together.

Moreover, in the related art, the balanced input type mixing circuit 114 is provided to correspond to the balanced output of the interstage tuning circuit 113 of the UHF-side block 101, and the unbalanced input type mixing circuit 124 is provided to correspond to the unbalanced output of the interstage tuning circuit 123 of the VHF-side block 102. Two front-stage circuits of an unbalanced output type and a balanced output type are provided. Then, as for rear-stage circuits, for example, upon amplification of a high-frequency amplifying circuit, two types of differential amplifying circuits, that is, an unbalanced input type differential amplifying circuit and a balanced input type differential amplifying circuit are also provided. In this case, costs and the size of the circuit are increased.

SUMMARY OF THE INVENTION

The invention has been finalized in view of the above-described problems, and it is an object of the invention to provide an electronic circuit that, even though a balanced output and an unbalanced output exist together, can cope with both a balanced output and an unbalanced output by one high-frequency circuit, without separately providing a balanced input type high-frequency circuit and an unbalanced input type high-frequency circuit, and can realize a reduction in costs and size, and a television tuner having such a television tuner.

According to an aspect of the invention, an electronic circuit includes a first high-frequency circuit that has first and second input terminals serving as differential input terminals, a second high-frequency circuit that has a first output terminal serving as an unbalanced output terminal, a third high-frequency circuit that has second and third output terminals serving as balanced output terminals, and a switch circuit that, in a first mode where the second high-frequency circuit is connected to the first high-frequency circuit, couples the first output terminal of the second high-frequency circuit to the first input terminal of the first high-frequency terminal and grounds the second input terminal of the first high-frequency terminal, and, in a second mode where the third high-frequency circuit is connected to the first high-frequency circuit, couples the second output terminal of the third high-frequency circuit to the first input terminal of the first high-frequency circuit and couples the third output terminal to the second input terminal.

According to this configuration, in the first mode, the second high-frequency circuit is coupled to the first high-frequency circuit, and the first high-frequency circuit can operate as an unbalanced input type. In the second mode, the third high-frequency circuit is coupled to the first high-frequency circuit, and the first high-frequency circuit can operate as a balanced input type. Accordingly, one high-frequency circuit can be switched between the unbalanced input type and the balanced input type by the switch circuit, and thus costs and size can be reduced.

In the electronic circuit according to the aspect of the invention, the switch circuit may have a first switch unit that is provided between the first output terminal of the second high-frequency circuit and the first input terminal of the first high-frequency terminal, a second switch unit that is provided between the second output terminal of the third high-frequency circuit and the first input terminal of the first high-frequency circuit, and a third switch unit that is provided between a connection point of the third output terminal of the third high-frequency circuit and the second input terminal of the first high-frequency circuit, and a ground. In the first mode, the first switch unit and the third switch unit may be closed, and the second switch unit may be opened. Further, in the second mode, the first switch unit and the third switch unit may be opened, and the second switch unit may be closed.

According to this configuration, in the first mode, the first switch unit and the third switch unit are closed, and the second switch unit is opened. Then, the second high-frequency circuit is coupled to the first high-frequency circuit, such that the first high-frequency circuit can operate as an unbalanced input type. In addition, in the second mode, the first switch unit and the third switch unit are opened, and the second switch unit is closed. Then, the third high-frequency circuit is coupled to the first high-frequency circuit, such that the first high-frequency circuit can operate as a balanced input type.

In addition, the first high-frequency circuit and the first to third switch units may be formed on an integrated circuit. Therefore, the balanced input type high-frequency circuit and the unbalanced input type high-frequency circuit do not need to be separately provided, and thus the size of the integrated circuit can be reduced.

DESCRIPTION OF THE PREFERRED EMBODIMENT

An embodiment of the invention will now be described with reference to the accompanying drawings.

Figure 1:
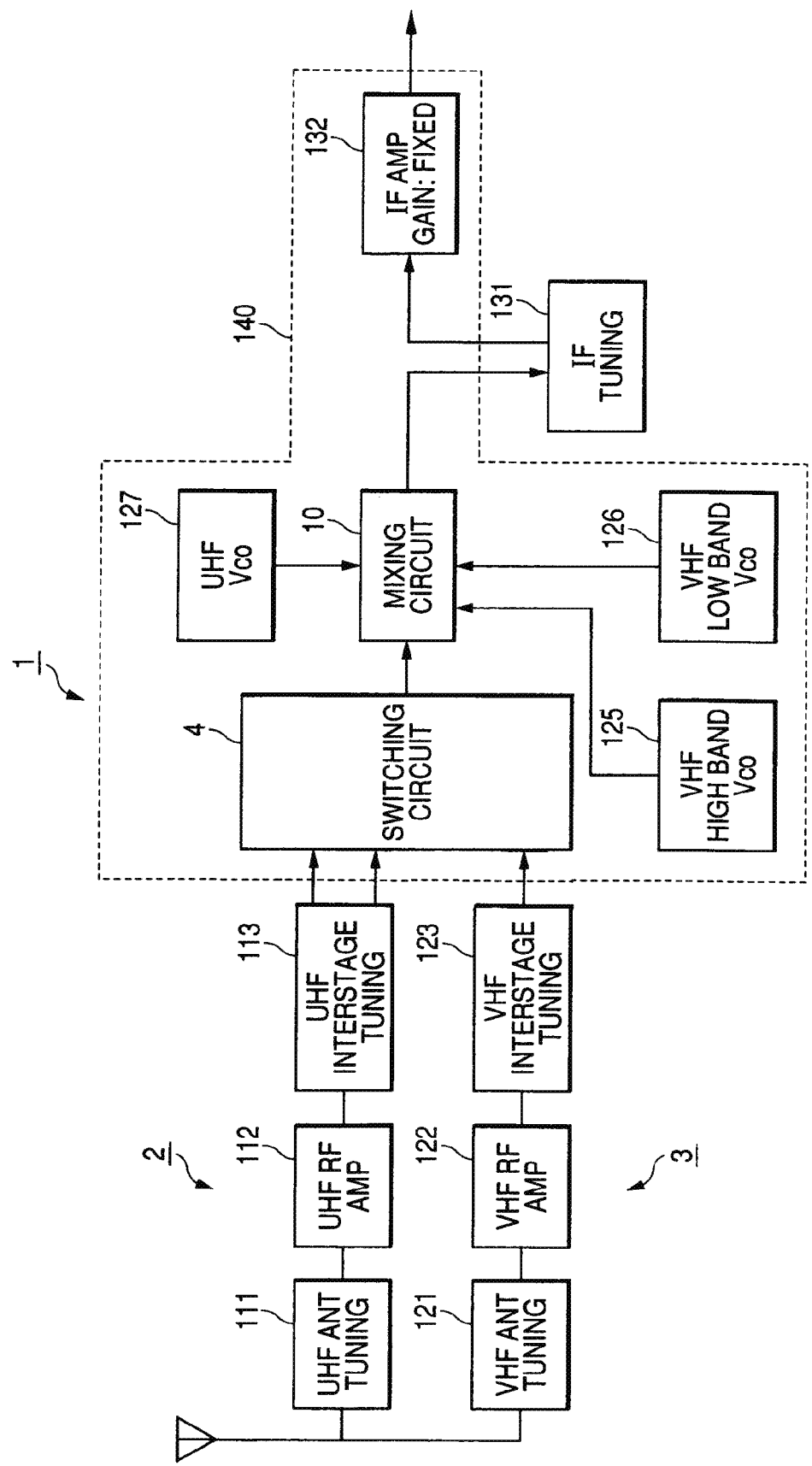
FIG. 1 is a functional block diagram of a television tuner according to an embodiment of the invention.
Figure 7:
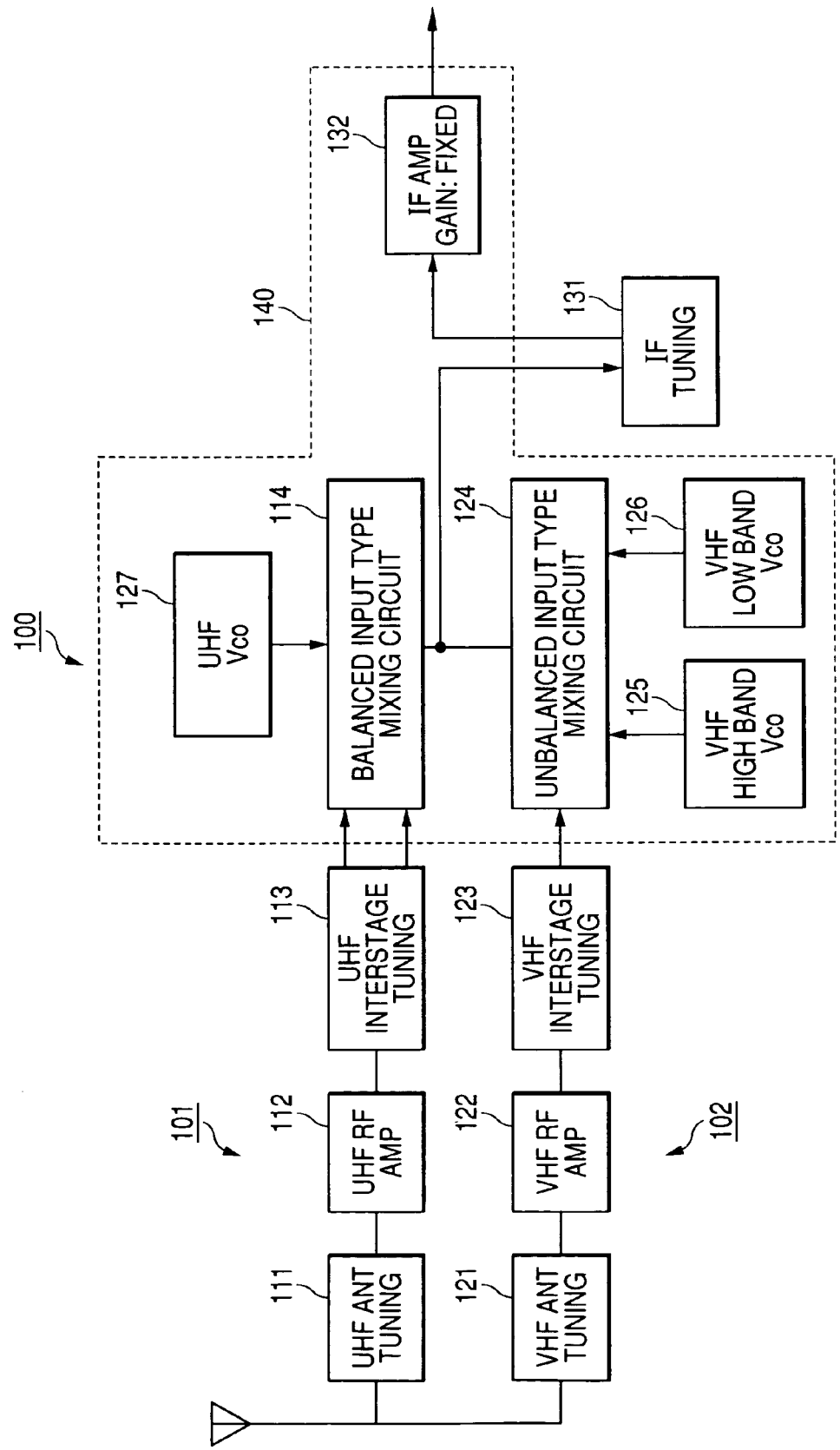
FIG. 7 is a functional block diagram of a television tuner according to the related art.

FIG. 1 is a diagram showing the configuration of a television tuner according to an embodiment of the invention. FIG. 1 shows the configuration from an antenna to an intermediate-frequency amplifying circuit, like FIG. 7. Moreover, the same parts as those of the television tuner shown in FIG. 7 are represented by the same reference numerals.

A television tuner 1 shown in FIG. 1 includes a UHF-side block 2 and a VHF-side block 3. The UHF-side block 2, which serves as a third high-frequency circuit, includes an antenna tuning circuit 111, a high-frequency amplifying circuit 112, an interstage tuning circuit 113, and a mixing circuit 10, which is shared by the VHF-side block 3. All the elements are sequentially connected in a cascade manner. Similarly, the VHF-side block 3, which serves as a second high-frequency circuit, includes an antenna tuning circuit 121, a high-frequency amplifying circuit 122, an interstage tuning circuit 123, and the mixing circuit 10, which is shared by the UHF-side block 2. All the elements are sequentially connected in a cascade manner. The interstage tuning circuit 113 of the UHF-side block 2 and the interstage tuning circuit 123 of the VHF-side block 3 are connected to the mixing circuit 10, which serves as a first high-frequency circuit, through a switch circuit 4. Local oscillation signals are supplied to the mixing circuit 10 from a VHF high-band oscillation circuit 125 or a VHF low-band oscillation circuit 126 and a UHF oscillation circuit 127. In addition, an output of the intermediate-frequency amplifying circuit 132 is extracted as an output of the television tuner 1 by a tuning circuit (not shown). Then, the output is extracted as a video signal by a video detection circuit through an intermediate-frequency amplifying circuit and a SAW filter that are provided in a television receiver (not shown).

Figure 2:
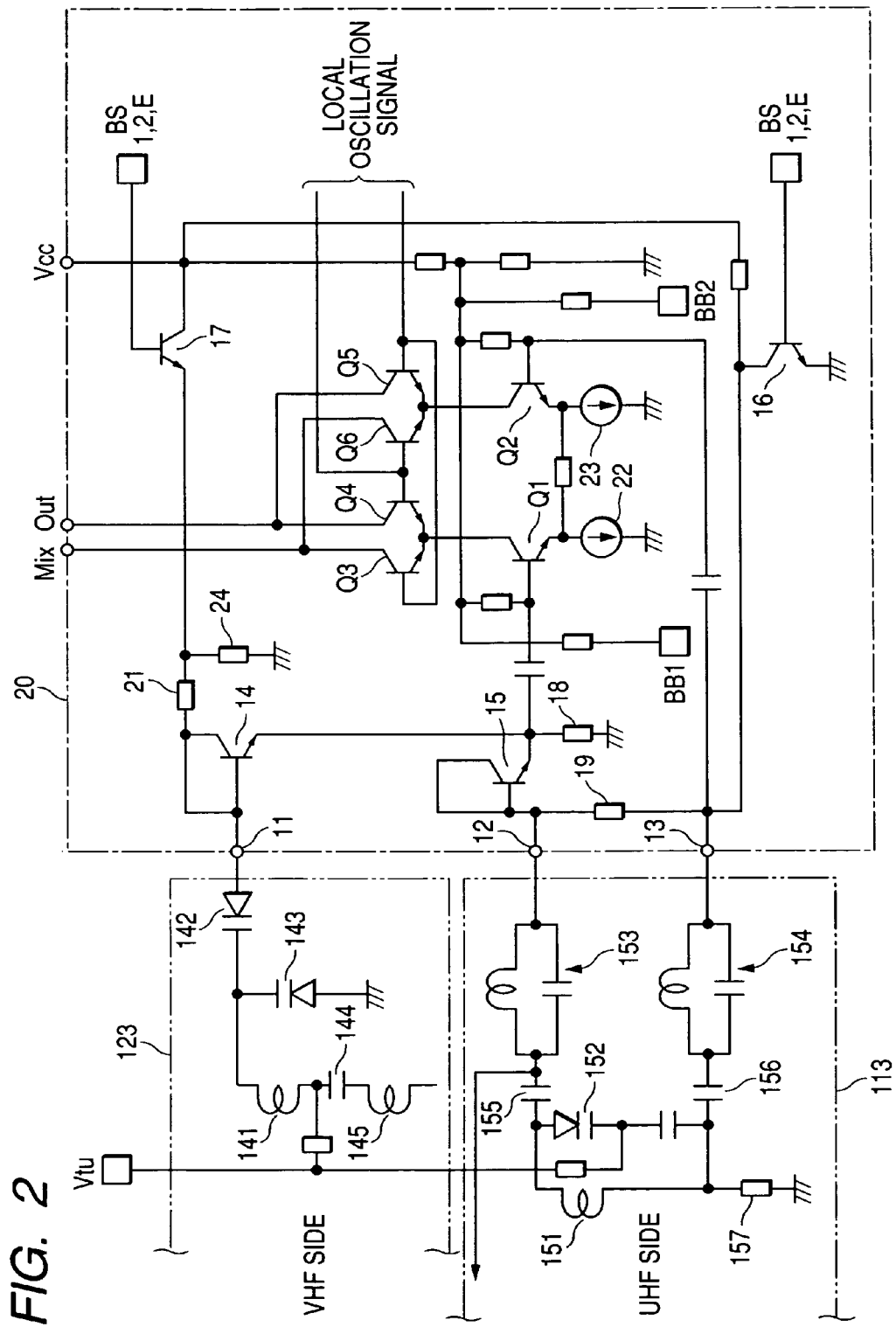
FIG. 2 is a diagram showing the circuit configuration laying emphasis on a switch circuit and a mixing circuit shown in FIG. 1.

FIG. 2 is a diagram showing the circuit configuration from secondary sides of the interstage tuning circuits 113 and 123 to the mixing circuit 10. On the secondary side of the interstage tuning circuit 123 of the VHF-side block 3, one end of an inductive element 141 is connected to a first terminal 11 of an IC board 20, on which the mixing circuit 10 is mounted, through a varactor diode 142, and is connected to a ground through another varactor diode 143. A connection terminal to the first terminal 11 of the interstage tuning circuit 123 becomes a first output terminal serving as an unbalanced output terminal. The other end of the inductive element 141 is connected in series to another inductive element 145 through a capacitor 144. An oscillation voltage Vtu is applied to cathodes of the varactor diodes 142 and 143, and an unbalanced output signal of the interstage tuning circuit 123 is input to the first terminal 11 of the mixing circuit 10.

Moreover, though not shown, the other end of the inductive element 145 is connected to an inductive element of the primary side and a ground through another inductive element.

On the secondary side of the interstage tuning circuit 113 in the UHF-side block 2, a varactor diode 152 is connected in parallel with an inductive element 151. One end of the inductive element 151 is connected to a second terminal 12 of the IC board 20, on which the mixing circuit 10 is mounted, through an LC parallel circuit 153. The other end of the inductive element 151 is connected to a third terminal 13 of the IC board 20 through an LC parallel circuit 154. A connection terminal to the second terminal 12 of the interstage tuning circuit 113 becomes a third output terminal serving as a balanced output terminal. A connection terminal to the third terminal 13 of the interstage tuning circuit 113 becomes a third output terminal serving as the other balanced output terminal. A capacitor 155 is provided between one end of the inductive element 151 and the LC parallel circuit 153. A capacitor 156 is provided between the other end of the inductive element 151 and the LC parallel circuit 154. The other end of the inductive element 151 is connected to a ground through a resistive element 157. The tuning voltage Vtu is applied to a cathode of the varactor diode 152, and the balanced output of the interstage tuning circuit 113 is applied to the second terminal 12 and the third terminal 13.

The first to third terminals 11 to 13 are provided on the IC board 20 having the mixing circuit 10, and the high-band oscillation circuit 125, the low-band oscillation circuit 126, and the UHF oscillation circuit 127 (not shown).

The switch circuit 4 has first to fourth transistors 14 to 17 as main parts. In the first transistor 14 that serves as a first switch unit, a base thereof is connected to a collector thereof and the first terminal 11. An emitter of the first transistor 14 is connected to a base of a transistor Q1, which serves as a first input terminal of the mixing circuit 10. At the same time, the emitter thereof is connected to a ground through a resistive element 18.

In the second transistor 15 that serves as a second switch unit, a base thereof is connected to a collector thereof and the second terminal 12. An emitter of the second transistor 15 is connected to the base of the transistor Q1, which serves as the first input terminal of the mixing circuit 10. At the same time, the emitter thereof is connected to the ground through the resistive element 18.

The third transistor 16 serving as a third switch unit has a collector, which is connected to the third terminal 13, the second terminal 12 through a resistive element 19, and a base of a transistor Q2, which serves a second input terminal of the mixing circuit 10. In addition, an emitter of the third transistor 16 is connected to the ground.

That is, when the third transistor 16 is turned on, the second and third terminals 12 and 13, to which the balanced output of the UHF-side block 2 is applied, can be grounded. At the same time, the second input terminal (the base of the transistor Q2) of the mixing circuit 10 can also be grounded.

A bias voltage Vcc is applied to a collector of the fourth transistor 17. An emitter of the fourth transistor 17 is connected to a collector and a base of the first transistor 14 through a resistive element 21. In addition, the collector of the first transistor 14 is connected to the base thereof and is grounded through a resistive element 24.

Figure 5:
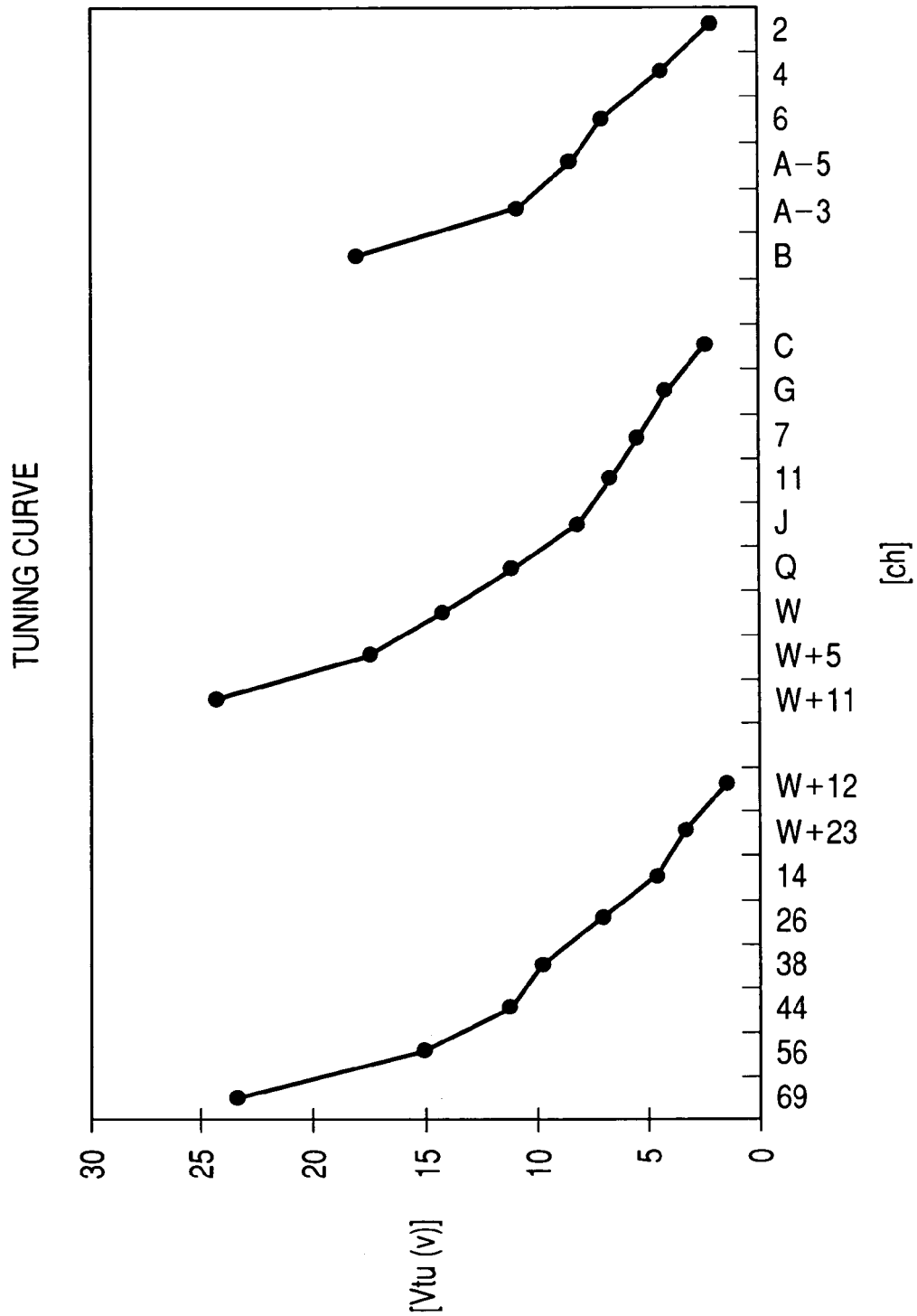
FIG. 5 is a diagram showing the relationship between a tuning voltage and channels.

Though not shown, the television tuner 1 has an IC for channel selection that has a PLL circuit therein. The IC for channel selection outputs a band-switching voltage or a tuning voltage according to channel-selection data input from the television receiver. The band-switching voltage includes Vlo for selecting a low-band of a VHF band, Vhi for selecting a high-band of a VHF band, and Vu for selecting a UHF band. In this embodiment, when the band-switching voltage Vlo is output, an ON signal BS1 is output. When the band-switching voltage Vhi is output, an ON signal BS2 is output. In addition, when the band-switching voltage Vu is output, an OFF signal BSE is output. The ON signals BS1 and BS2, and the OFF signal BSE are applied to the bases of the third transistor 16 and the fourth transistor 17. In addition, the PPL circuit of the IC for channel selection generates a tuning voltage on the basis of the channel-selection data, local oscillation signals output from the high-band oscillation circuit 125, the low-band oscillation circuit 126, and the UHF oscillation circuit 127, and a reference signal output from a reference oscillation circuit. The relationship between the oscillation voltage Vtu and channel-selection data ch is shown in FIG. 5. On the basis of a tuning curve shown in FIG. 5, the tuning voltage Vtu depending on a selected channel is output.

The circuit configuration of the mixing circuit 10 will now be described. Emitters of the transistors Q1 and Q2 are connected to each other. The emitters of the transistors Q1 and Q2 are grounded through current sources 22 and 23. A first differential circuit has the transistors Q1 and Q2.

Emitters of transistors Q3 and Q4 are connected to each other. A second differential circuit has the transistors Q3 and Q4. A connection point of the emitters of the transistors Q3 and Q4 is connected to the collector of the transistor Q1 constituting the first differential circuit.

Emitters of transistors Q5 and Q6 are connected to each other. A third differential circuit is configured to have the transistors Q5 and Q6. A connection point of the emitters of the transistors Q5 and Q6 is connected to the collector of the transistor Q2 constituting the first differential circuit.

A base of the transistor Q3 and a base of the transistor Q5 are connected to each other. The base of the transistor Q4 and a base of the transistor Q6 are connected to each other. Local oscillation signals from the respective oscillation circuits 125 to 127 are applied to the connection points of the transistors Q3 and Q5, and the transistors Q4 and Q6. An intermediate-frequency signal is output between collectors of the transistors Q3 and Q6 that are connected to each other. Further, an intermediate-frequency signal is output between collectors of the transistors Q4 and Q5 that are connected to each other. The intermediate-frequency signal is extracted from an output terminal (Mix out) of the IC board 20, and is input to the intermediate-frequency tuning circuit 131.

The operation of this embodiment having the above-described configuration will now be described.

When the high-band of the VHF band is selected, the ON signal BS1 is supplied so as to turn on the third transistor 16 and the fourth transistor 17. In addition, a reference voltage of a mixing input circuit in the IC is controlled as a bias voltage BB1 for optimizing a mixing operation of the mixing circuit 10. The mixing input circuit in the IC means an input circuit that guides a select television signal to the bases of the transistors Q1 and Q2.

When the low-band of the VHF band is selected, like the selection of the high-band, the ON signal BS2 is supplied so as to turn on the third transistor 16 and the fourth transistor 17. In addition, the reference voltage of the mixing input circuit in the IC is controlled as a bias voltage BB2 for optimizing a mixing operation of the mixing circuit 10.

Figure 3:
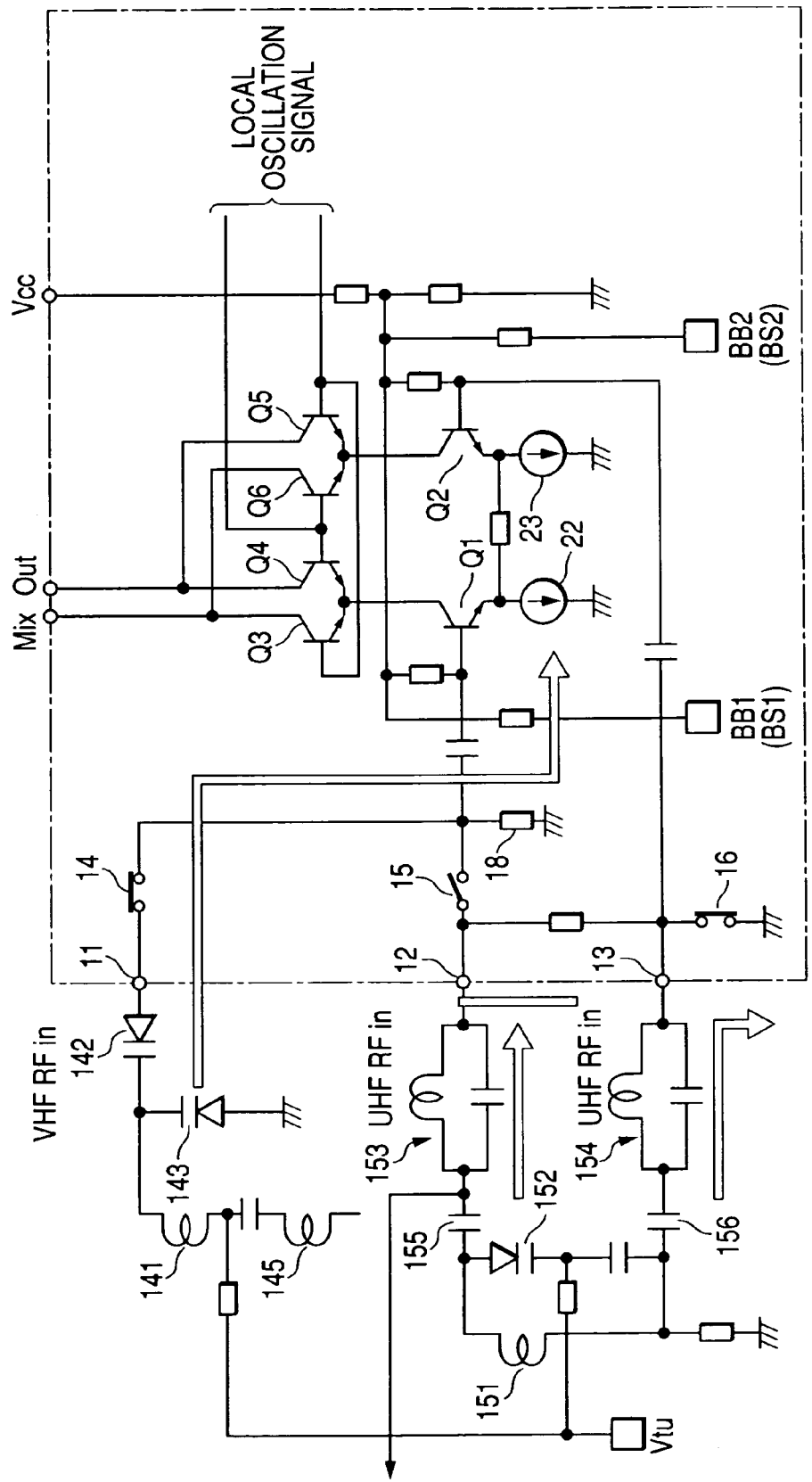
FIG. 3 is a diagram illustrating the operation of an unbalanced input when a VHF band is selected.

FIG. 3 is a diagram illustrating the operation when the low-band or the high-band of the VHF band is selected. When the ON signals BS1 and BS2 for turning on the third transistor 16 and the fourth transistor 17 are supplied, as regards a balanced output of the interstage tuning circuit 113 of the UHF-side block 2, the second terminal 12 and the third terminal 13, to which the balanced output is applied from the interstage tuning circuit 113, are grounded through the collector and the emitter of the third transistor 16. Meanwhile, as regards an unbalanced output of the interstage tuning circuit 123 of the VHF-side block 3, the first transistor 14 that has a gate connected to the first terminal 11 is turned on. In this case, the unbalanced output of the interstage tuning circuit 123 is applied to the first terminal 11. Then, the interstage tuning circuit 123 of the VHF-side block 3 is connected to the gate of the transistor Q1 serving as the first input terminal of the mixing circuit 10. The gate of the transistor Q2 serving as the second input terminal of the mixing circuit 10 is grounded through the collector and the emitter of the third transistor 16.

That is, when the low-band or the high-band of the VHF band is selected, the balanced input of the interstage tuning circuit 113 of the UHF-side block 2 is cut off, but the unbalanced input of the interstage tuning circuit 123 of the VHF-side block 3 is coupled to one input terminal of the mixing circuit 10. Further, the other input terminal of the mixing circuit 10 is grounded. Accordingly, the unbalanced input type mixing circuit 10 is formed.

When the UHF band is selected, the OFF signal BSE is supplied so as to turn off the third transistor 16 and the fourth transistor 17. In addition, the reference voltage of the mixing input circuit in the IC is controlled as the bias voltage BBE for optimizing a mixing operation of the mixing circuit 10.

Figure 4:
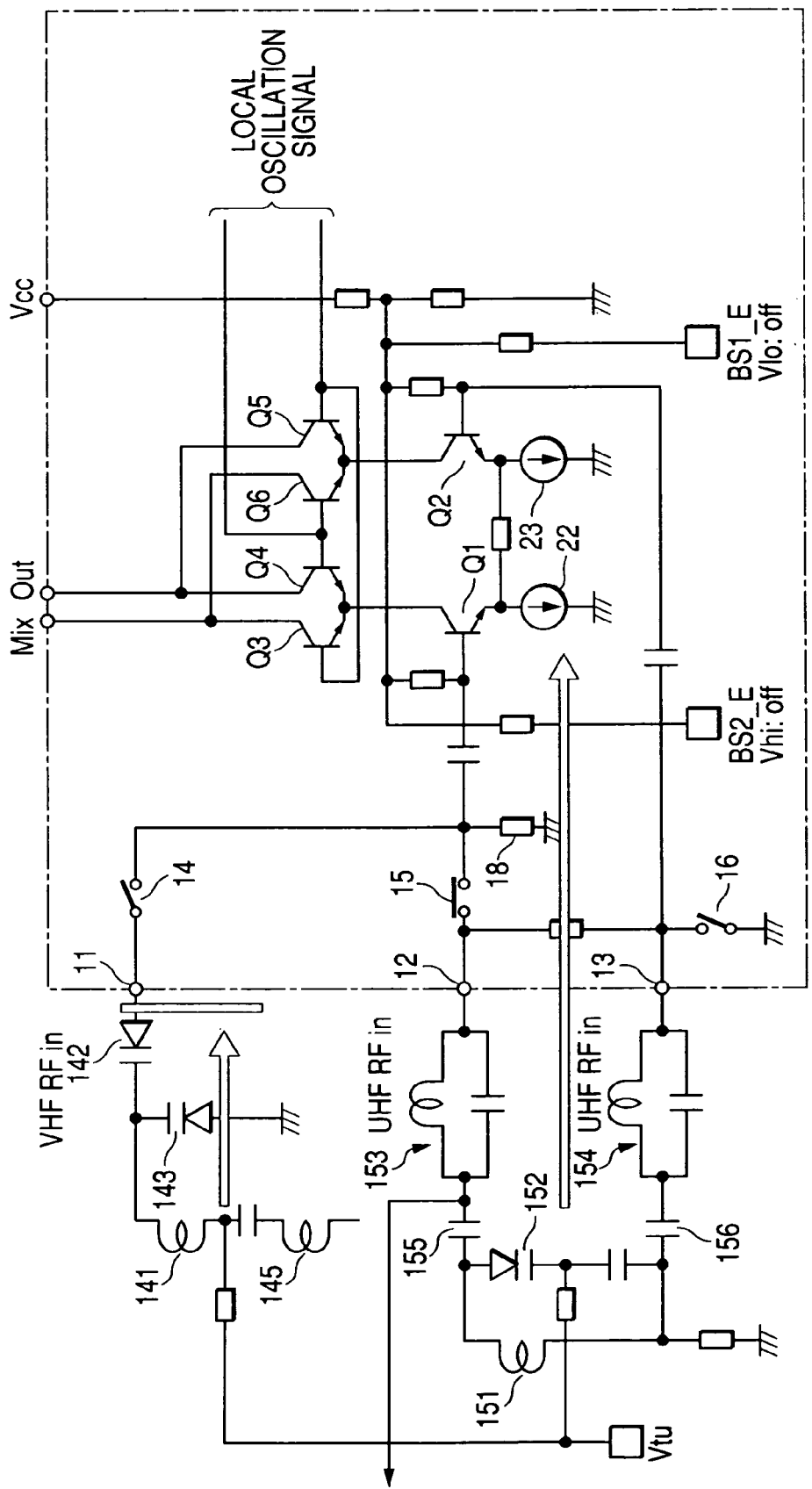
FIG. 4 is a diagram illustrating the operation of a balanced input when a UHF band is selected.

FIG. 4 is a diagram illustrating the operation when the UHF band is selected. When the UHF band is selected, the OFF signal BSE is supplied so as to turn off the third transistor 16 and the fourth transistor 17. When the fourth transistor 17 is turned off, the bias voltage Vcc is not applied to the collector of the first transistor 14, and the base of the first transistor 14 is grounded through the resistive elements 21 and 24. As a result, the first transistor 14 is turned off, and the interstage tuning circuit 123 of the VHF-side block 3 and the first terminal (the base of the transistor Q1) of the mixing circuit 10 are disconnected from each other.

Meanwhile, since the base of the third transistor 16 is turned off by the OFF signal BSE, the second terminal 12, to which one balanced output is applied from the interstage tuning circuit 113 of the UHF-side block 2, is coupled to the first input terminal (the gate of the transistor Q1) of the mixing circuit 10 through the second transistor 15. In addition, the third terminal 13, to which the other balanced output is applied from the interstage tuning circuit 113 of the UHF-side block 2, is coupled to the second input terminal (the base of the transistor Q2) of the mixing circuit 10. That is, when the UHF band is selected, the balanced input type mixing circuit 10 is formed, such that the interstage tuning circuit 113 of the UHF-side block 2 is coupled to the first input terminal (the base of the transistor Q1) and the second input terminal (the base of the transistor Q2) of the mixing circuit 10.

Figure 6:
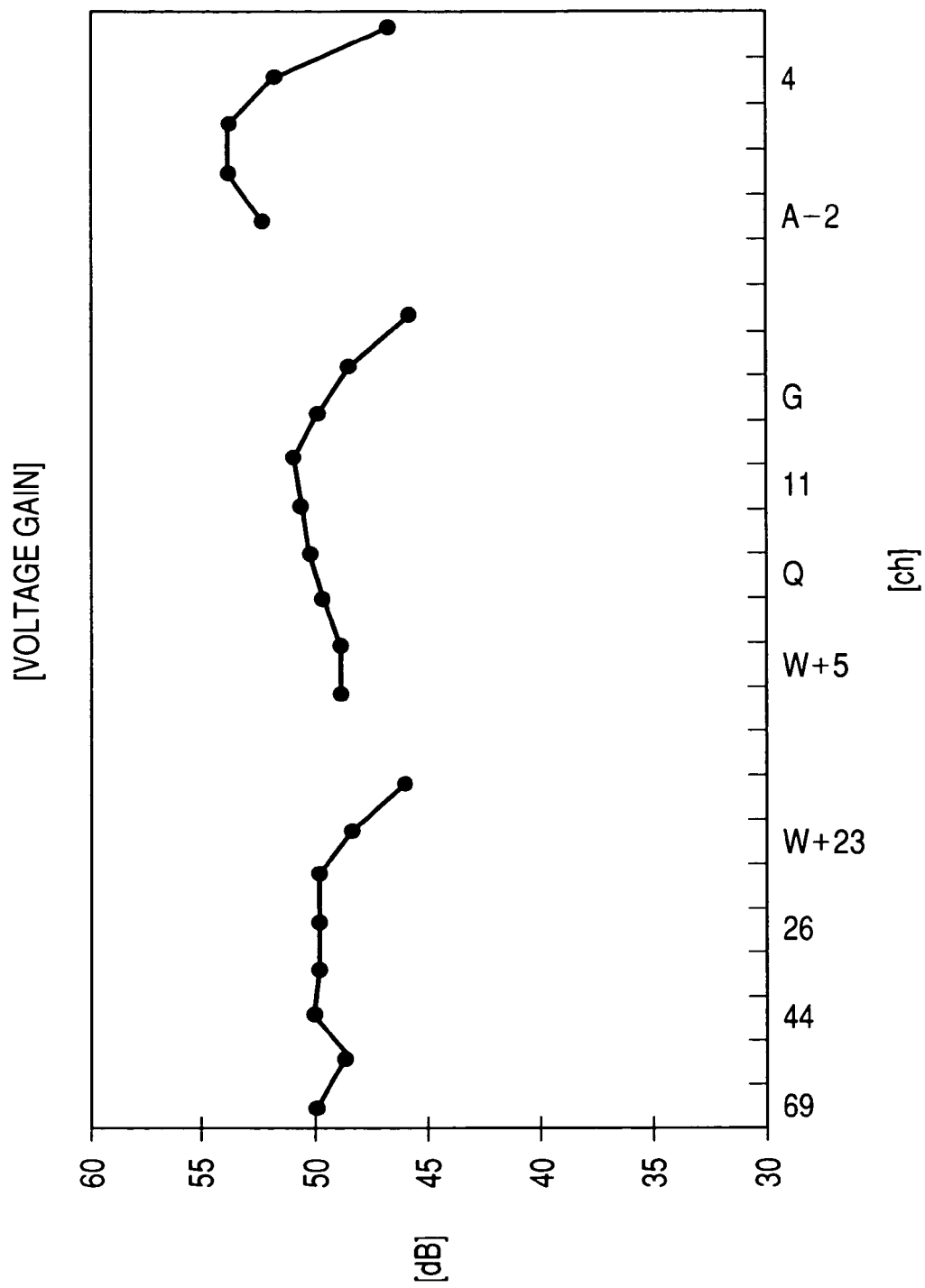
FIG. 6 is a diagram showing gain characteristics of an RF input and an IF output.

FIG. 6 is a gain characteristic diagram in the circuit configuration shown in FIG. 2. FIG. 6 shows a gain of an IF output from the intermediate-frequency amplifying circuit 132 to an RF input to the antenna tuning circuits 111 and 121 when the UHF band is selected, when the high-band of the VHF band is selected, and when the low-band of the VHF band is selected. In FIG. 6, even though the mixing circuit is switched between the balanced input type and the unbalanced input type, like this embodiment, a flat gain characteristic is obtained for all channels in the UHF band and the high band of the VHF band. A flat gain characteristic is also obtained for a considerable number of channels in the low-band of the VHF band.

According to this embodiment, the mixing circuit 10, to which the balanced output is supplied from the interstage tuning circuit 113 of the UHF-side block 2, and the unbalanced output is supplied from the interstage tuning circuit 123 of the VHF-side block 3, can be switched between the balanced input type or the unbalanced input type by the switch circuit 4. Therefore, it is possible to cope with both the unbalanced output and the balanced output by using one mixing circuit 10. As a result, with one mixing circuit, a reduction in cost and size can be realized.

The invention is not limited to the above-described embodiment, but various modifications can be made without departing from the sprit or scope of the invention.

For example, the invention may be applied to an electronic circuit which amplifies a balanced output and an unbalanced output from a front-stage high-frequency circuit by a rear-stage high-frequency amplifying circuit. When the unbalanced output is input to the high-frequency amplifying circuit, in a state where a second input terminal of the high-frequency amplifying circuit is grounded by a switch circuit, a first input terminal thereof is coupled to the front-stage unbalanced output type high-frequency circuit, and the front-stage balanced output type high-frequency circuit is disconnected. In addition, when the balanced output is input to the high-frequency amplifying circuit, the first input terminal and the second input terminal of the high-frequency amplifying circuit are coupled to the front-stage balanced output type high-frequency circuit by the switch circuit, and the front-stage unbalanced output type high-frequency circuit is disconnected.

In addition to the high-frequency amplifying circuit, the invention may be applied to a high-frequency circuit that is of an unbalanced input type or a balanced input type, like the above-described embodiment.

In the above-description, the television tuner is illustrated, but an electronic circuit according to the invention is not limited to the television tuner.

The invention may be applied to various kinds of electronic devices that have a balanced output and an unbalanced output together.

According to an aspect of the invention, it is possible to provide an electronic circuit that, even though a balanced output and an unbalanced output exist together, can cope with both a balanced output and an unbalanced output by one high-frequency circuit, without separately providing a balanced input type high-frequency circuit and an unbalanced input type high-frequency circuit, and can realize a reduction in costs and size, and a television tuner having such an electronic circuit.

The invention claimed is:

1. An electronic circuit comprising:
   a first high-frequency circuit that has first and second input terminals serving as differential input terminals;
   a second high-frequency circuit that has a first output terminal serving as an unbalanced output terminal;
   a third high-frequency circuit that has second and third output terminals serving as balanced output terminals; and
   a switch circuit that, in a first mode where the second high-frequency circuit is connected to the first high-frequency circuit, couples the first output terminal of the second high-frequency circuit to the first input terminal of the first high-frequency terminal and grounds the second input terminal of the first high-frequency terminal, and, in a second mode where the third high-frequency circuit is connected to the first high-frequency circuit, couples the second output terminal of the third high-frequency circuit to the first input terminal of the first high-frequency circuit and couples the third output terminal to the second input terminal.

2. The electronic circuit according to claim 1,
   wherein the switch circuit has:
   a first switch unit that is provided between the first output terminal of the second high-frequency circuit and the first input terminal of the first high-frequency terminal,
   a second switch unit that is provided between the second output terminal of the third high-frequency circuit and the first input terminal of the first high-frequency circuit, and
   a third switch unit that is provided between a connection point of the third output terminal of the third high-frequency circuit and the second input terminal of the first high-frequency circuit, and a ground,
   in the first mode, the first switch unit and the third switch unit are closed, and the second switch unit is opened, and
   in the second mode, the second switch unit is closed, and the first switch unit and the third switch unit are opened.

3. The electronic circuit according to claim 1,
   wherein the first high-frequency circuit and the first to third switch units are directly formed on an integrated circuit.

4. The electronic circuit according to claim 1, wherein the first high-frequency circuit is a mixing circuit, the second high-frequency circuit is a VHF circuit, and the third high-frequency circuit is a UHF circuit.

5. A television tuner mounted thereon the electronic circuit according to claim 1.

* * * * *